United States Patent

Loessi

[15] 3,694,760

[45] Sept. 26, 1972

[54] FEEDBACK SWITCHING CIRCUIT FOR ELIMINATING ERROR SIGNALS

[72] Inventor: Jack C. Loessi, Ellicott City, Md.

[73] Assignee: The United States of America as represented by the Secretary of the Navy

[22] Filed: Sept. 30, 1970

[21] Appl. No.: 76,900

[52] U.S. Cl. ..........................330/9, 330/35, 330/24

[51] Int. Cl. ..........................H03f 1/02

[58] Field of Search ..........................330/51, 9

[56] References Cited

UNITED STATES PATENTS 3,516,002 6/1970 Hillis ..........................330/51

3,541,320 11/1970 Beall ..........................330/9 X

*Primary Examiner*—Nathan Kaufman

*Attorney*—Richard S. Sciascia, J. A. Cook & R. J. Erickson

[57] ABSTRACT

Apparatus for eliminating error currents normally prevalent when an associated operational amplifier is disconnected from its input source. A feedback arrangement comprising a field effect transistor switch in conjunction with a memory circuit reflects these error signals to the operational amplifier via a differential buffer amplifier, thereby causing said operational amplifier to null out the effects of the error currents.

4 Claims, 4 Drawing Figures

INVENTOR.
JACK C. LOESSI
BY J. O. Tresansky
ATTORNEY

INVENTOR.
JACK C. LOESSI
BY
ATTORNEY

FEEDBACK SWITCHING CIRCUIT FOR ELIMINATING ERROR SIGNALS

BACKGROUND OF THE INVENTION

The present invention relates to a circuit for eliminating error currents and more particularly for eliminating error currents associated with operational amplifiers.

It is frequently desirable to be able to open and close the feedback loop associated with operational amplifier circuits. Because of their very high OFF resistance and low bidirectional ON resistance, field effect transistors are very well suited to perform the switching function. However, in prior art circuit arrangements, whenever a positive voltage is applied to the field effect transistor to turn it off, a gate leakage current is injected into the operational amplifier input. Additionally, to compound the problem, there is almost always an input bias current associated with an operational amplifier. As the direction or magnitude of this current is usually very poorly defined, it probably contributes to an even larger error signal.

SUMMARY OF THE INVENTION

In carrying out the present invention the sources of error signals associated with operational amplifiers are reduced by a very significant amount by utilizing a field effect transistor differential buffer amplifier, a field effect transistor switch of the same conductivity, and a memory circuit. With this circuit arrangement the error currents are nulled out by the operational amplifier, thereby permitting the output of the operational amplifier to remain at a constant level regardless of changes in temperature and other environmental conditions.

An object of the present invention is to provide circuitry that will eliminate leakage current associated with operational amplifiers.

Another object is the utilization of field effect transistors in a feedback loop to eliminate leakage currents.

Still another object is the utilization of a field effect transistor as on on-off switch in a feed-back loop for eliminating leakage currents.

A further object of the instant invention is the use of field effect transistors as a differential buffer amplifier for the elimination of leakage currents.

Still another object is the elimination of gate leakage currents and input bias leakage currents normally associated with operational amplifiers.

DESCRIPTION OF THE PREFERRED EMBODIMENT

Figure 1A:
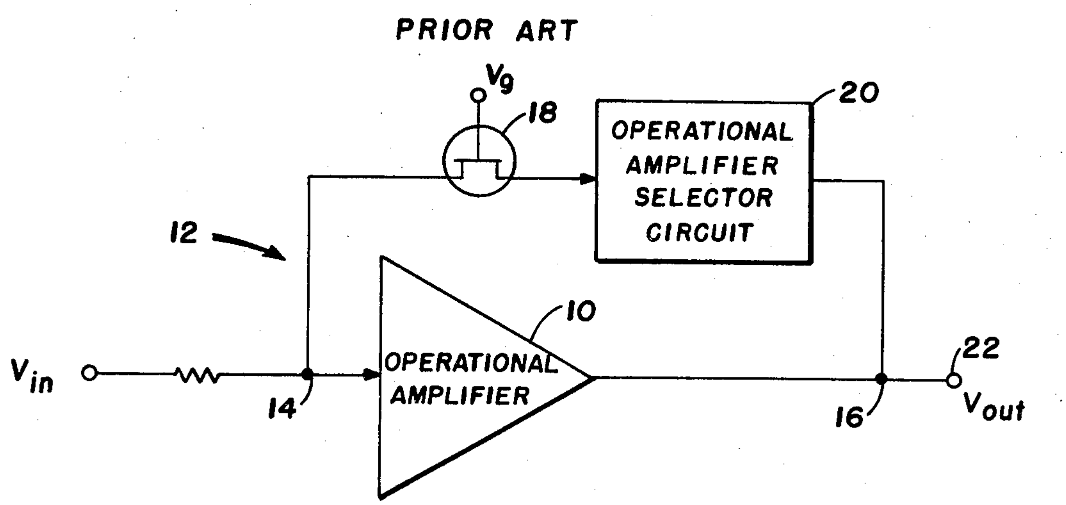
FIGS. 1*a* and 1*b* are block diagrams showing prior art feedback switching circuits.
Figure 1B:
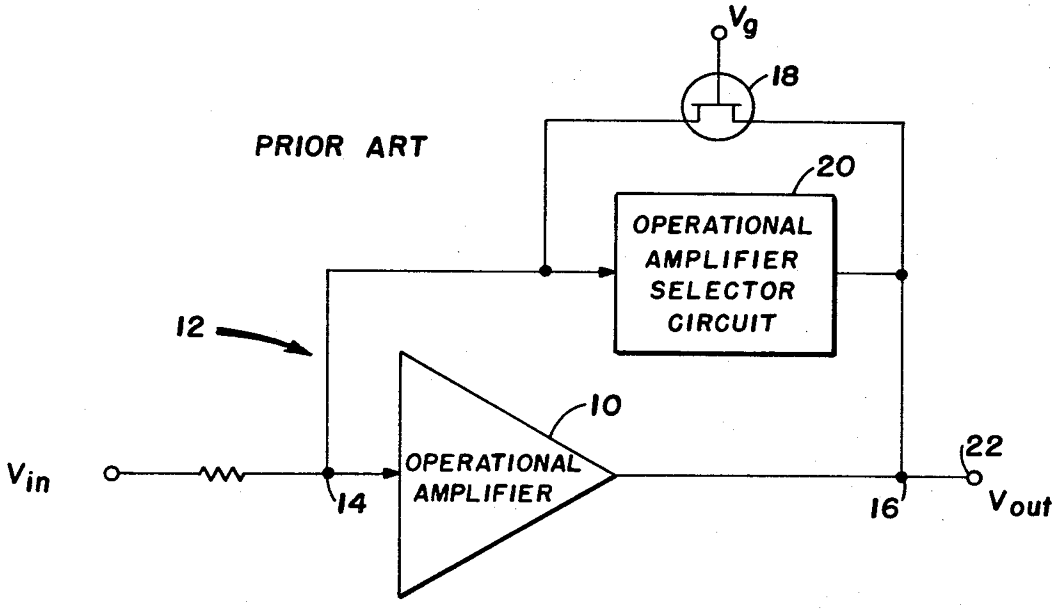

Referring now to FIGS. 1*a* and 1*b*, there are shown prior art feedback switching arrangements utilized for the purpose of switching an operational amplifier on and off. In FIG. 1*a* there is shown an operational amplifier 10 in conjunction with a feedback loop shown generally at 12. Terminal 14 connects said feedback loop 12 to the input of operational amplifier 10 and terminal 16 connects the output of operational amplifier 10 with feedback loop 12. Within feedback loop 12 are field effect transistor switch 18 and operational amplifier selector circuit 20. The purpose of operational amplifier selector circuit 20 is to select the operation i.e. integration, differentiation, etc. of amplifier 10. In the circuit of FIG. 1*a*, when it is desired that the operational amplifier 10 be ineffective, field effect transistor switch 18 opens, thereby disconnecting feedback loop 12. This operation causes the operational amplifier to cease functioning, whereby error and leakage signals from the operational amplifier are introduced into the output. However, associated with operational amplifier 10 is a control voltage which is reflected at output terminal 22 when field effect transistor switch 18 is opened. In FIG. 1*b* there is shown the same circuit as is shown in FIG. 1*a* except that field effect transistor switch 18 is in parallel with operational amplifier selector circuit 20. Thus, in FIG. 1*a*, when field effect transistor switch 18 opens there appears at output terminal 22 an offset voltage. This offset voltage introduces an unwanted error signal. If operational amplifier 10 is an integrator, it will integrate to that value as specified by the operational amplifier selector circuit 20 but at the output terminal 22 there will be reflected the integrating voltage plus the offset voltage.

Figure 2:
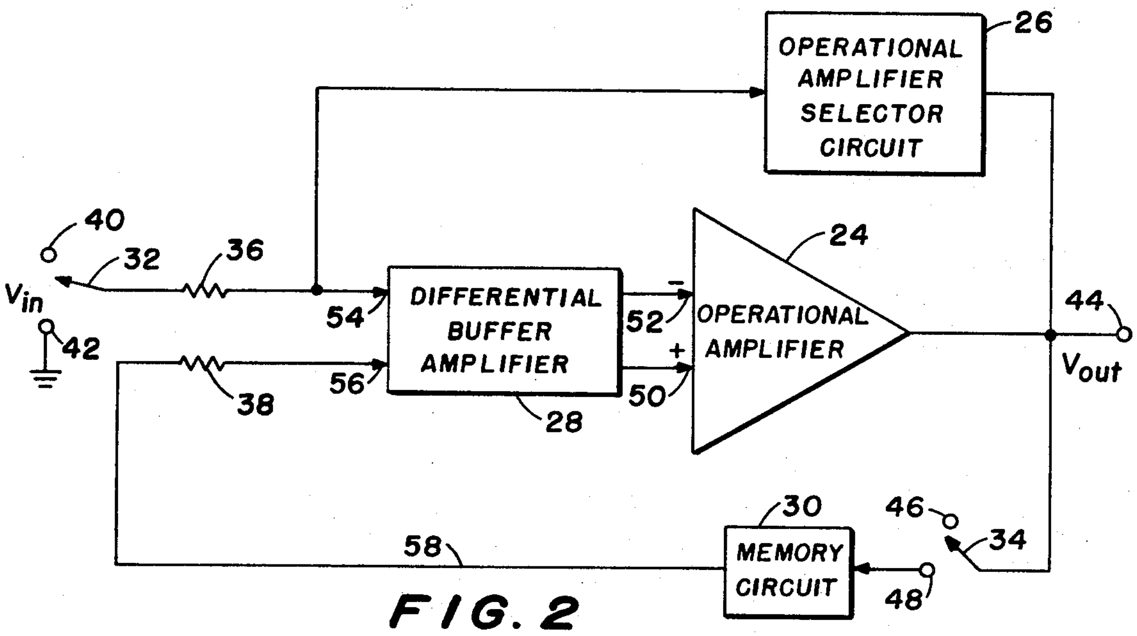
FIG. 2 is a block diagram of the present invention.

Referring now to FIG. 2, there is shown a block diagram of the present invention which consists basically of an operational amplifier 24, an operational amplifier selector circuit 26, a differential buffer amplifier 28, a memory circuit 30, switches 32 and 34, resistors 36 and 38, and terminals 40, 42, 44, 46, and 48. The positive and negative inputs, 50 and 52 respectively, of operational amplifier 24 are connected to the outputs of differential buffer amplifier 28.

The input signal is applied to input terminal 40. The differential buffer amplifier 28 receives the input signal at differential buffer amplifier input 54 when switch 32 is connected to input terminal 40. When switch 32 is connected to terminal 42 the differential buffer amplifier does not receive any input signal but rather receives via input 56 the signal from memory circuit 30. When switch 32 is connected to terminal 40, switch 34 is likewise connected to terminal 46. Similarly, when switch 32 is connected to terminal 42, switch 34 is connected to terminal 48. When switch 32 is connected to terminal 40, the input signal is received by the operational amplifier 24 at input 52. Since switch 32 is connected to terminal 40, switch 34 is connected to terminal 46 and accordingly input 50 of operational amplifier 24 does not receive any signal from feedback loop 58 via input 56 of differential buffer amplifier 28. Thus output terminal 44 reflects the output of the operational amplifier 24 as determined by the operational amplifier selector circuit 26 and resistor 36. When switch 32 is disconnected from terminal 40 and connected to terminal 42 the operation of the operational amplifier 24 will cease due to the lack of input signal. At this time the switch 34 also will be disconnected from terminal 46 and be connected to terminal 48, thereby applying to memory circuit 30 the d.c. offset error signals and leakage received from operational amplifier 24. The memory circuit 30 will reflect these error signals to operational amplifier 24 at input 50 via differential buffer amplifier 28. This error feedback signal will cause the operational amplifier 24 to stabilize and eventually null out these error signals. In this manner the output terminal 44 reflects a zero voltage when the operational amplifier 24 is in the steady state mode, i.e., switches 32 and 34 are connected to terminals 42 and 48 respectively.

Figure 3:
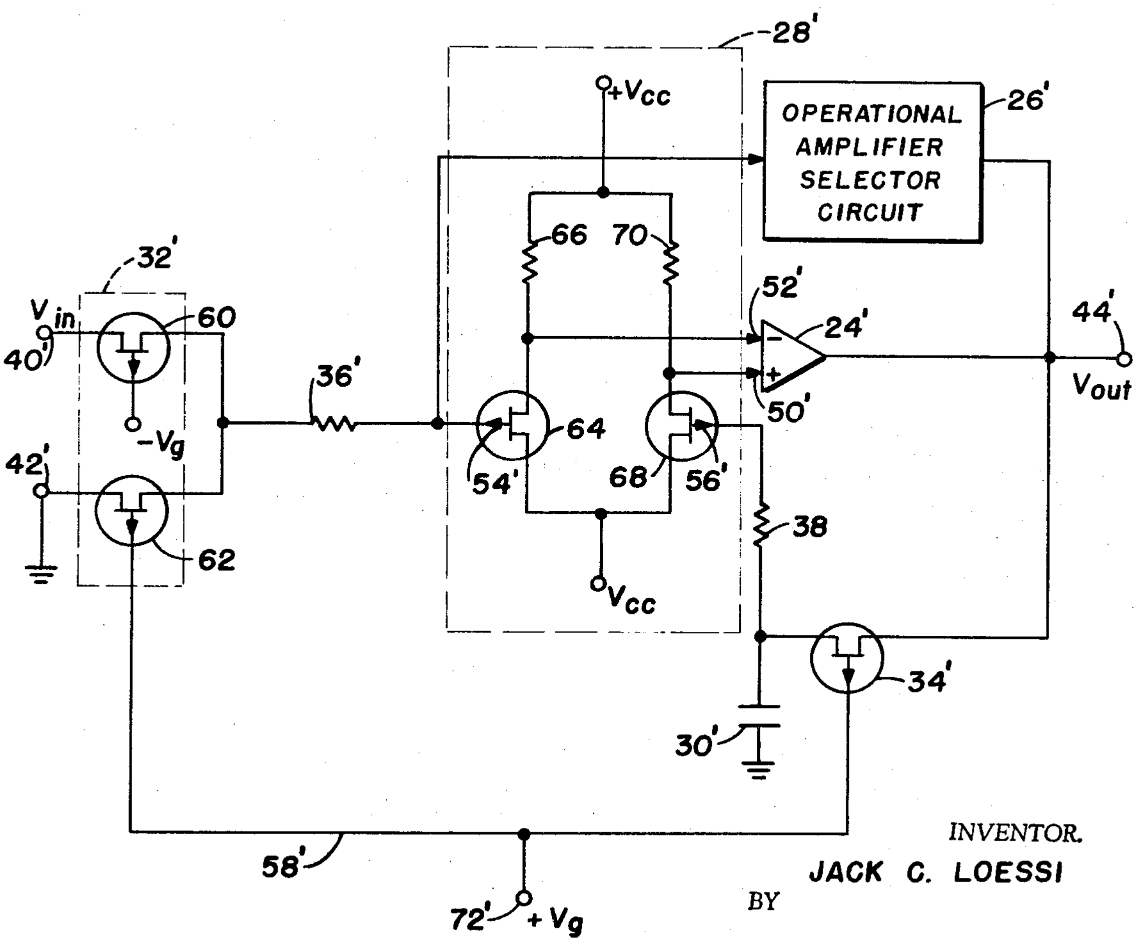
FIG. 3 is a detailed schematic of the present invention.

Referring now to FIG. 3, there is shown in greater detail the preferred embodiment of the present invention. That in FIG. 3 which is equivalent to that in FIG. 2 will be denoted by a prime of the same reference numeral. The switches 32 and 34 of FIG. 2 are replaced by field effect transistor switches 32' and 34'. More specifically, switch 32' comprises first and second field effect transistor switches 60 and 62. When field effect transistor switch 60 is biased on, the input signal at terminal 40' is applied to input 54' of differential buffer amplifier 28'. Differential buffer amplifier 28' comprises field effect transistor 64 and its associated biasing resistor 66 and field effect transistor 68 and biasing resistor 70. Field effect transistor 64 and 68, like all usual field effect transistors consist of a gate, a source and a drain. The gate of field effect transistor 64 serves as input 54' for differential buffer amplifier 28'. Also, the gate of field effect transistor 68 serves as input 56' for differential buffer amplifier 28'. As was mentioned previously in the discussion of FIG. 2 input 56 of differential buffer amplifier 28 receives the feedback signal 58 of memory circuit 30 when switch 34 is connected to terminal 48. In the preferred embodiment of FIG. 3, the memory circuit 30 is replaced by capacitor 30' and switch 34 is replaced by field effect transistor switch 34'. The gates of both field effect transistor switch 34' and field effect transistor switch 62 are connected to a source of bias potential at terminal 72. Therefore, when field effect transistor switch 60 is biased so as to transmit the input signal from terminal 40' to operational amplifier 24', field effect transistor switches 62 and 34' are biased so as to render them non-conductive. Consequently the output terminal 44' reflects the output of the operational amplifier 24' as determined by the operational amplifier selector circuit 26' (which will be an inductor if differentiation is desired or a capacitor if integration is desired) and resistor 36'. When the bias voltage is applied to terminal 72 so as to render switch 62 conductive, the bias applied at field effect transistor switch 60 renders said switch nonconductive, and accordingly the operational amplifier 24' receives no input at 52'. Also, when the bias voltage renders switch 62 conductive field effect transistor switch 34' is also made conductive and thereby allows the output of operational amplifier 24', i.e., the d.c. offset error signals and leakage signals, to be applied to capacitor 30'. The voltage on capacitor 30' will be reflected to operational amplifier 24' at input 50' via field effect transistor 68 of differential buffer amplifier 28'. The feedback error and leakage signals will thereby cause the operational amplifier 24' to stabilize and eventually null out the feedback error and leakage signals. As mentioned previously, in this manner the output terminal reflects zero voltage when the input signal is disconnected from the operational amplifier.

Obviously many modifications and variations of the present invention are possible in light of the above teachings. It is therefore to be understood that within the scope of the appended claims, the invention may be practiced otherwise than specifically desired.

I claim:

1. Means for eliminating error signals, comprising:
a first input terminal for receiving an input signal;
a second input terminal connected to ground;
an output terminal;
amplifier circuit means having a feedback path arrangement:
a first input for receiving said input signal from said first input terminal, said amplifier circuit means exhibiting error signals when said first input is not receiving said input signal;
a second input for receiving said error signals from said feedback path arrangement, said amplifier circuit means thereupon eliminating the effect of said error signals;
amplifier operation selection means connected in electrical parallelism across said amplifier circuit means, said amplifier operation selection means determining the nature of the signal from said amplifier circuit means to be impressed upon said output terminal,
memory circuit means connected in said feedback path arrangement with said amplifier circuit means, said memory circuit means reflecting said error signals to said second input of said amplifier circuit means, thereby causing said amplifier circuit means to eliminate the effect of said error signals;
first and second bias potential sources;
means for reflecting either said input signal or said error signal to said amplifier circuit means, said reflecting means comprising:
a first field effect transistor comprising,
a gate connected to said first input terminal,
a source connected to said first bias potential source, and
a drain connected to said first input of said amplifier circuit means, and
a second field effect transistor comprising,
a gate connected to the output of said memory circuit means,
a source connected to said first bias potential source, and
a drain connected to said second input of said amplifier circuit means,
a first switching means connected intermediate said first and second input terminals and said gate of said first field effect transistor of said reflecting means, said first switching means applying either said input signal or ground potential to said gate of said first field effect transistor; and
a second switching means connected intermediate said output terminal and said memory circuit means, said second switching means interrupting said feedback path arrangement when said first switching means is connected to said first input terminal, thereby allowing said input signal to be applied to said amplifier circuit means and completing said feedback path arrangement when said first switching means is connected to said second input terminal, thereby allowing said error signals to be applied to said amplifier circuit means.

2. The invention recited in claim 1, wherein said first switching means comprises:

a third field effect transistor comprising,
- a gate connected to said second gate bias source,
- a source connected to said first input terminal, and
- a drain connected to said gate of said first field effect transistor; and a fourth field effect transistor comprising:
- a gate connected to said second gate bias source,
- a source connected to said second input terminal, and
- a drain connected to said gate of said first field effect transistor whereby when one of said third or fourth field effect transistors is in a state of conduction the other is in a state of non-conduction.

3. The invention as recited in claim 2, wherein said second switching means is a fifth field effect transistor comprising
- a gate connected to said second gate bias source,
- a source connected intermediate said output terminal and the output of said operational amplifier and
- a drain connected to said gate of said second field effect transistor,
- said fifth field effect transistor being in a state of conduction whenever said fourth field effect transistor is in a state of conduction.

4. The invention as recited in claim 3 wherein said memory circuit means is a capacitor having
- a first plate connected intermediate said drain of said fifth field effect transistor and said gate of said second field effect transistor, and
- a second plate connected to ground.

* * * * *